(12) United States Patent
Tan

(10) Patent No.: US 7,613,967 B1
(45) Date of Patent: *Nov. 3, 2009

(54) INVERSION OF SCAN CLOCK FOR SCAN CELLS

(75) Inventor: Teck Wee Patrick Tan, Penang (MY)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/290,262

(22) Filed: Oct. 29, 2008

Related U.S. Application Data

(63) Continuation of application No. 10/903,971, filed on Jul. 29, 2004, now Pat. No. 7,447,961.

(51) Int. Cl.
*G01R 31/28* (2006.01)

(52) U.S. Cl. .................. 714/726; 714/729; 714/731

(58) Field of Classification Search .................. 714/726, 714/729, 731
See application file for complete search history.

(56) References Cited

U.S. PATENT DOCUMENTS

| | | | |
|---|---|---|---|
| 5,450,418 A | 9/1995 | Ganapathy | |
| 5,570,375 A | 10/1996 | Tsai et al. | |
| 5,619,511 A | 4/1997 | Sugisawa et al. | |
| 5,668,490 A | 9/1997 | Mitra et al. | |
| 5,828,579 A | 10/1998 | Beausang | |
| 6,070,260 A | 5/2000 | Buch et al. | |
| 6,114,892 A | 9/2000 | Jin | |
| 6,185,710 B1 | 2/2001 | Barnhart | |
| 6,266,801 B1 | 7/2001 | Jin | |
| 6,269,463 B1 | 7/2001 | Duggirala et al. | |
| 6,374,380 B1 | 4/2002 | Sim | |
| 6,393,592 B1 | 5/2002 | Peeters et al. | |
| 6,412,098 B1 | 6/2002 | Jin | |
| 6,518,788 B2 * | 2/2003 | Kasahara ..................... 326/46 |
| 6,640,324 B1 | 10/2003 | Goldovsky | |
| 6,728,915 B2 | 4/2004 | Whetsel | |
| 6,877,123 B2 | 4/2005 | Johnston et al. | |

FOREIGN PATENT DOCUMENTS

| | | | |
|---|---|---|---|
| JP | 2003-202362 | | 7/2003 |
| JP | 2003-2022362 | * | 7/2003 |

OTHER PUBLICATIONS

Makar, Handling Multiple Clock DOmains in Scan Design, 1999, EETimes Online (Google.com), pp. 1-6.*
Saxena et al., Scan-based Transition Fault Testing—Implementation and Low Cost Test Challenges, Apr. 2002, IEEE, pp. 1120-1129.*

* cited by examiner

*Primary Examiner*—John J Tabone, Jr.

(57) ABSTRACT

A device includes a scan circuit including a scan chain. The scan chain includes a first plurality of scan cells that receive a first scan clock signal in a first clock domain. A second plurality of scan cells receives a second scan clock signal in a second clock domain. A scan clock source generates the first scan clock signal and the second scan clock signal, and selectively inverts the first scan clock signal and the second scan clock signal based on an operating mode of the first plurality of scan cells and the second plurality of scan cells, respective flip-flop arrangements of the first clock domain and the second clock domain.

16 Claims, 9 Drawing Sheets

CLKT1

CLKT2

CLKT1

CLKT2

INVERSION OF SCAN CLOCK FOR SCAN CELLS

CROSS-REFERENCE TO RELATED APPLICATIONS

This application is a continuation of U.S. patent application Ser. No. 10/903,971, filed Jul. 29, 2004 now U.S. Pat. No. 7,447,961. The disclosure of the above application is incorporated herein by reference in its entirety.

BACKGROUND

1. Technical Field

Embodiments of the present invention are related to the field of electronic devices, and in particular, to scan cells.

2. Description of Related Art

A typical integrated circuit (IC) chip has combination logic circuits which are coupled by flip-flops or latches controlled by a plurality of clock signals, with the combination logic circuits and latches utilizing a particular clock signal defining one of a plurality of functional clock domains. For example, in one illustrative IC chip, there are more than 30 different internal functional clock domains with frequency ranging from 1 KHz to 312 MHz.

Referring to FIG. 1, Design-For-Testability (DFT) mechanisms for an IC chip 10 include utilizing a plurality of scan cells 12 to perform manufacturing tests on the IC chip 10. In one scan cell design, sometimes referred to as a "mux flip-flop", each scan cell 12 has a flip-flop 14, such as a D-flip-flop, and a multiplexer 16. Each scan cell 12 has a normal mode of operation and scan mode of operation, which is selected by the select signal SE coupled to the multiplexers 16. During the normal mode, data signals D are provided from the multiplexers 16 to the flip-flops 14 and during the scan mode, a test pattern or scan-in signal SI is provided from the multiplexers 16 to the flip-flops 14. In this simplified example, four flip-flops 14A, 14B, 14C, and 14D are illustrated.

During the scan mode, well-known sequential-test problems may be avoided by turning flip-flops 14 of a Device-Under-Test (DUT) at input and output nodes of combination logic circuits 18 into externally loadable and readable elements. These flip-flops 14 are chained together as a single serial shift register to form a scan chain 20, with an output SO of one flip-flop 14 being coupled to an input SI of the next flip-flip 14. With respect to a given combination logic circuit 18, a portion of a serial data of an appropriate the scan-in signal SI, in the form of a test pattern or vector, is loaded into flip-flop 14 at an input node to set it to a predetermined state. The combination logic circuit 18 then functions in a normal manner, with the test pattern being launched from the flip-flop 14 at the first node to propagate through the logic circuit 18 so as to generate a system response. The system response to the test pattern is latched by the flip-flop 14 at an output node on the other side of the logic circuit 18 and then is shifted out of the DUT in a scan-out operation and analyzed for improper operation.

During the normal mode, each functional clock domain has its own system clock, as illustrated by a simplified example having two clock domains 22 and 24 with system clocks CLK1 and CLK2, respectively, coupled to the flip-flops 14. The two clocks have a different frequency and the interface between the two clock domains 22 and 24 defines a clock crossing 26. The flip-flops 14 in the first clock domain 22 are labeled "F1" and in the second clock domain 24 are labeled "F2". During a normal mode of operation, the data signal D is passed along via the flip-flops 14, which are synchronized using system clocks CLK1 and CLK2. During the scan mode, the test pattern is shifted in and the system response is shifted out using scan clocks CLKT1 and CLKT2 in the clock domains 22 and 24, which are driven from different external scan clock input pins (not shown). In one embodiment, the systems clocks are frozen during the scan-in and scan-out operations which use the scan clocks. In one prior art implementation, the scan clock CLKT1 may be driven by a Power Management Unit (PMU) and the scan clock CLKT2 may be driven by another scan clock pin, although the paths for the system and scan clocks are coupled together as shown in FIG. 1. Between these operations, the flip-flops 14 apply the test pattern to the input of the corresponding combination logic circuit 18 on a first pulse of the system clocks. Then the flip-flops 14 capture or latch the system response from the combination logic circuits 18 on a second pulse of the system clocks.

The scan clocks CLKT1 and CLKT2 are "in-phase" at the scan clock input pins, but by the time they arrive at the flip-flops 14, there may be clock skew. This clock skew is caused by the scan clocks CLKT1 and CLKT2 propagating by different clock distribution paths having different propagation delays. To compensate for the clock skew at the interface of the two clock domains 22 and 24, a lockup latch (LU) 28 is interposed into the scan chain 20 between at SO output of one flip-flop 14 and the SI input of the next flip-flop 14 at the clock crossing 26. During scan data shifting, the lockup latch 28 holds the data from the flip-flop 14B for a half clock cycle before it propagates to the next flip-flop 14C. With respect to flip-flops 14B and 14C, when both are positive edge-triggered flips or both are negative edge-triggered flip-flops, then the lockup latch 28 is interposed between them, with the scan clocks being in-phase. Referring to FIG. 2, the solid arrows illustrate the triggering edges of the scan clocks CLKT1 and CLKT2 for two positive edge-triggered flip-flops and the dashed arrows illustrates the triggering edges of the scan clocks CLKT1 and CLKT2 for two negative edge-triggered flip-flops. In FIG. 2 the scan clocks are "in-phase" with an original clock (not shown). When one clock domain has positive edge-triggered flip-flops and the other clock domain has negative edge-triggered flip-flop, the negative edge-triggered flip-flops are placed first in the scan chain (become flip-flops F1) followed by the positive edge-triggered flip-flops (become flip-flops F2) and the lockup latch 28 is not used.

With more than 30 different internal clock domains with frequency ranging from 1 KHz to 312 MHz in the illustrative chip 10, it is a challenge to test all the scan chains 20 that reside in so many different clock domains with these varying clock frequencies and complex clock tree structures, all of which need careful scan timing balancing. Presently, this challenge is addressed by providing extra external scan clock inputs to drive the clock distribution networks (not shown) to the scan cells 12, which may increase the total scan pin count and pattern size or/and may add large numbers of buffers to balance the clock distribution networks. This in turn may increase DFT implementation overhead and may increase die and testing costs.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 3:
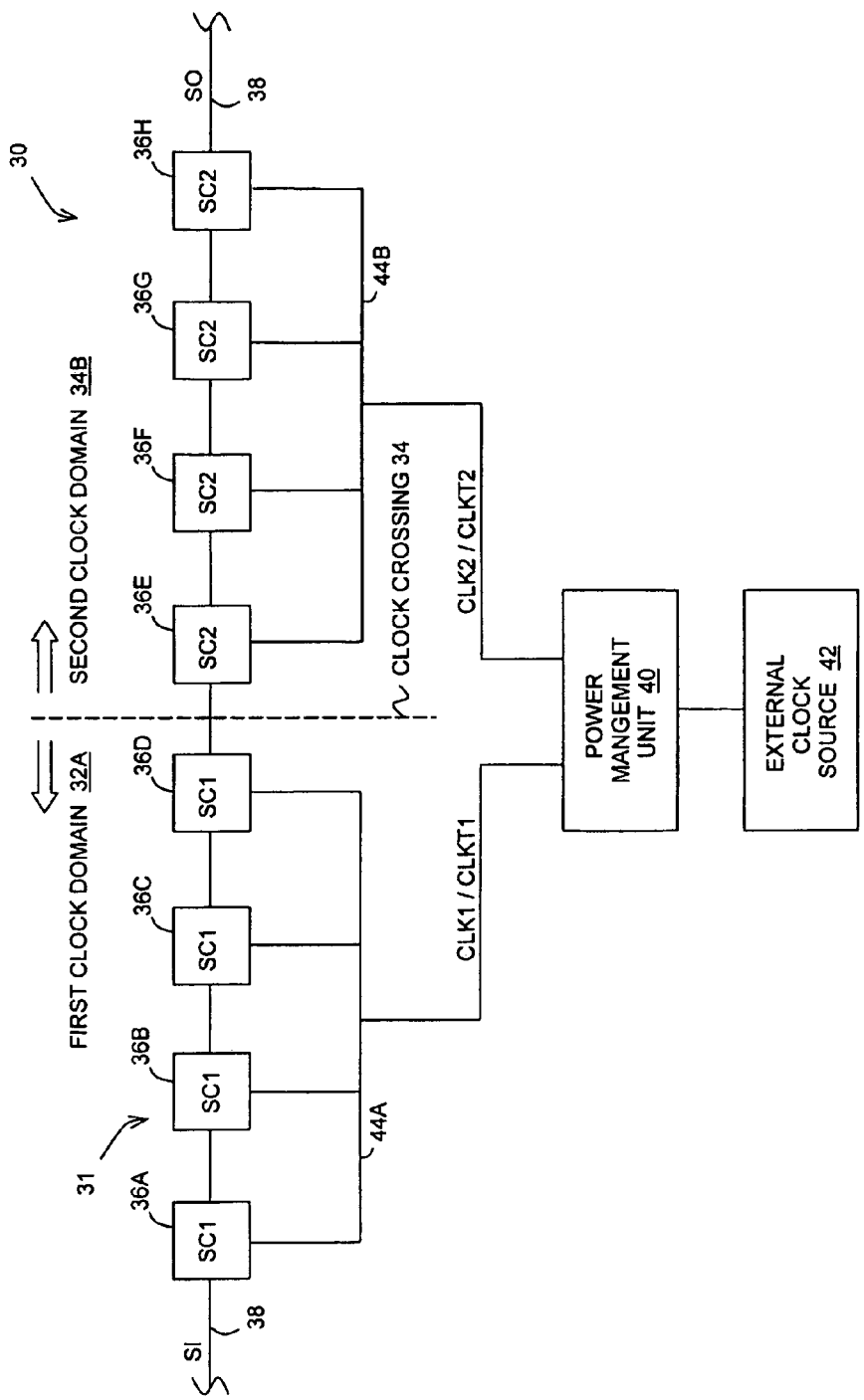
FIG. 3 is a block diagram illustrating one scan chain of a chip which traverses multiple clock domains in accordance with one embodiment of the present invention.

With reference to FIG. 3, there is illustrated an integrated circuit (IC) chip 30 having a plurality of clock domains 32, with two such clock domains being illustrated by the first clock domain 32A and the second clock domain 32B. The interface of the illustrative clock domains 32A and 32B is shown by a clock crossing 34. The IC chip 30 may include scan circuit 31 which includes a plurality of scan cells 36 (illustrated by scan cells 36A-H) with scan cells 36D and 36E being on opposed sides of the clock crossing 34. Each scan cell 36 has a normal mode of operation and a scan mode of operation, as previously described in the Background section. In one embodiment according to the present invention, the scan circuit 31 may have a plurality of scan chains 38 (only one illustrated in FIG. 3), with each scan chain 38 being formed by coupling the scan cells 36 together as a single serial register during the scan mode of operation. In one embodiment, the scan cells 36 may comprise the scan cells 12 of FIG. 1 which have the multiplexer 16 and the flip-flop 14. In another embodiment, the scan cells 36 may comprise a full-hold scan cell with a shadow flip-flop forming part of the scan chain 38 as will be described hereinafter.

The scan chain 38 traverses the clock crossing 34, with those scan cells 36 in first clock domain 32A being labeled as scan cells "SC1" and those scan cells 36 in the second clock domain 32B being labeled as scan cells "SC2". A power management unit (PMU) 40 may provide the various clock signals for the various clock domains 32. In one embodiment, an original clock source 42 may provide the PMU 40 with original clock signals. In one embodiment, the original clock source 42, during the normal mode of operation, may provide an original clock signal having a frequency of 104 MHz. In another embodiment, the PMU 40 may include one or more Phase Lock Loops (PLLs). During the normal mode of operation of this embodiment, the original clock signal from the original clock source 42 to PMU 40 may be 13 MHz or 104 MHz during a PLL bypass mode. During the normal mode of operation, the PMU 40 may support multiple core system clock configurations such as: 312 MHz, 208 MHz, and 104 MHz. In one embodiment, the PMU 40 may have a 1:1 clock ratio mode, wherein the original clock frequency of 104 MHz equals the internal clock frequency is 104 MHz. During the scan mode of operation, the scan clocks may have a frequency of 10 MHz. This may also be the case during a PLL bypass test mode. With the inverted internal clock being provided by the PMU 40, both of the scan clocks CLKT1 and CLKT2 may be driven by same scan clock source, contrary to the implementation described in the prior art.

In one embodiment, during the scan mode of operation, the PMU 40 may provide 10 MHz scan clock signals to the clock domains 32; however, some of these scan clock signals are inverted relative to others. The original clock source 42, during the scan mode of operation, may provide an original clock signal having a frequency of 10 MHz one-at-a-time to each of a plurality of external scan pins of the PMU 40. In turn, the PMU 40 may provide an inverted scan clock signal and a non-inverted scan clock signal in response to the original clock signal received at one of the external scan pins from the original clock source 42.

Depending on the mode of operation, the PMU 40 may be referred to as a "scan clock source" and a "system clock source". Under certain conditions, the PMU 40 inverts the scan clock to one of the clock domains 32A and 32B and the scan cells SC1 and SC2 are arranged in a desired order so that the latch 28 of FIG. 1 may be eliminated and the number of scan chains 20 may be reduced, as will be described in detail hereinafter.

In both modes of operation, the internal clocks may be distributed from the PMU 40 to the various clock domains 32 by a plurality of clock distribution networks 44. For example, two clock distribution networks 44A and 44B for the clock domains 32A and 32B, respectively, are illustrated in FIG. 3. During the normal mode, the clock distribution networks 44A and 44B may distribute system clocks CLK1 and CLK2, respectively, to the clock domains 32A and 32B, respectively. During the scan mode, the clock distribution networks 44A and 44B may distribute scan clocks CLKT1 and CLKT2, respectively, to the clock domains 32A and 32B, respectively. In one embodiment, such clock distribution networks may use a tree configuration to distribute the clock signals through balanced paths traversing the same number of gates and having similar lengths to reduce clock skew. In other embodiments, different configurations of clock distribution networks may be used, such as using low impedance clock distribution lines. Distribution of the scan clocks may use of the previously-described 1:1 clock ratio mode.

Figure 4:
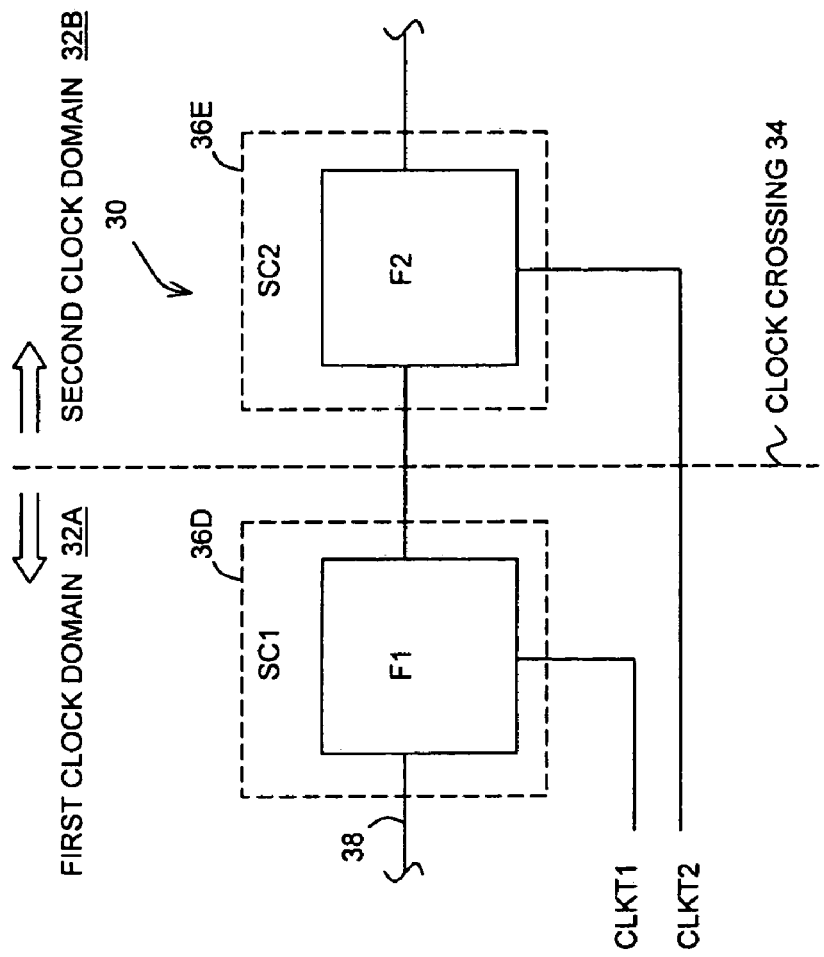
FIG. 4 is a block diagram of a portion of the scan chain of FIG. 3 in accordance with one embodiment of the invention.

Referring to FIG. 4, the two scan cells 36D and 36E on opposed sides of the clock crossing 34 of FIG. 3 are illustrated. Each of the scan cells SC1 contains a flip-flop F1 and each of the scan cells SC2 contains a flip-flop F2. In FIG. 4 only the flip-flops F1 and F2 of the scan cells 36D and 36E are illustrated.

Figure 1:
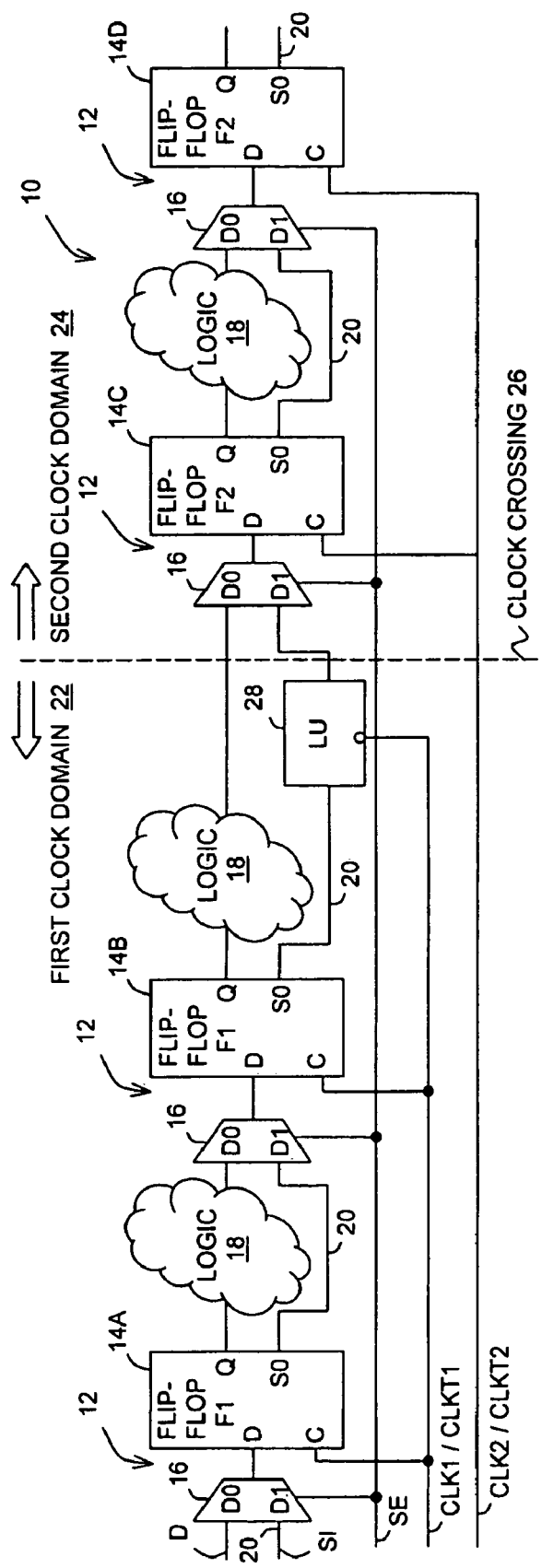
FIG. 1 is a block circuit diagram of a prior art integrated circuit (IC) chip with multiple clock domains having at least one scan chain traversing a clock crossing.
Figure 2:
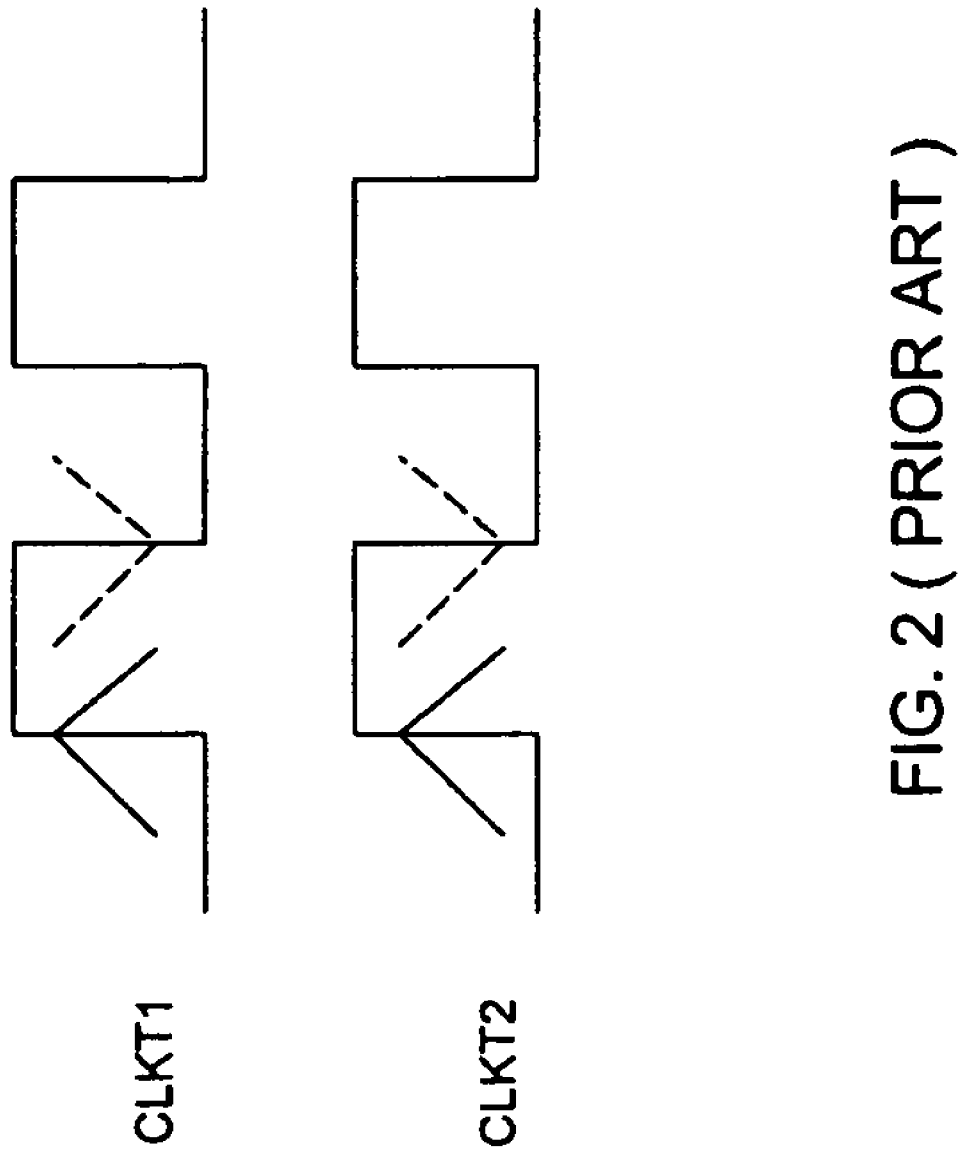
FIG. 2 is a timing diagram of non-inverted, in-phase scan clocks for the illustrative clock domains of FIG. 1.
Figure 5:
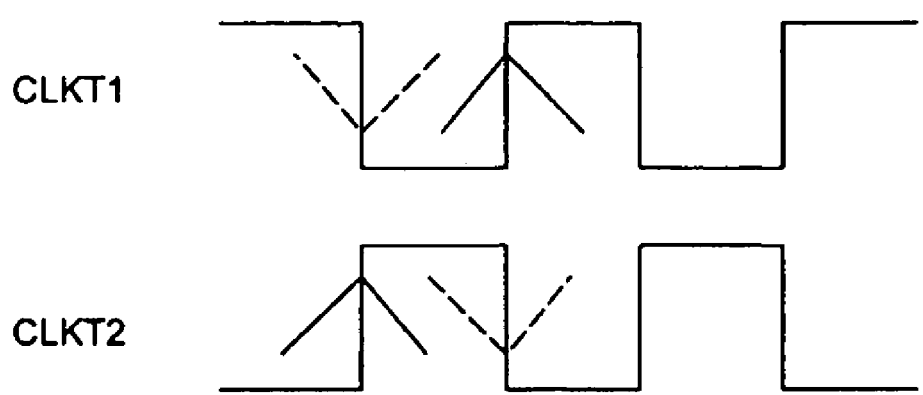
FIG. 5 is a timing diagram of two out-of-phase scan clocks used for the scan chain of FIGS. 3 and 4 when the scan chain includes positive edge-triggered flip-flops.

Referring to FIG. 4 and the timing diagram of FIG. 5, the flip-flops F1 and F2 may be positive edge-triggered flip-flops, as shown by the solid arrows on the rising edges of the scan clocks CLKT1 and CLKT2 in FIG. 5. The scan clock CLKT1 is inverted (180 degrees out of phase) relative to the scan clock CLKT2. More specifically, using in-phase waveforms of FIG. 2 as a frame of reference (which are in phase with the original clock), the first clock CLKT1 is inverted in FIG. 5. By inverting the clock CLKT1 the positive edge-triggered flip-flops F1 act like negative edge-triggered flip-flops. Hence, the flip-flop F1 of scan cell 36D acts as a negative edge-triggered flip-flop and the flip-flop F2 of the scan cell 36E is a positive edge triggered flip-flop, thereby creating an equivalent combination of having first a negative edge triggered flip-flop followed by a positive edge flip-flop at the clock crossing 34. As a result of (1) the scan clock CLKT1 being inverted relative to the scan clock CLKT1 and (2) the flip-flops F1 (which are driven by the scan clock CLKT1) coming first in the scan chain 38 relative to the flip-flops F2 (which are driven by the scan clock CLKT2), the lockup latch 28 of FIG. 1 is not needed. Regardless of the frame of reference for determining whether or not the scan clocks have been inverted, the flip-flops F2 are triggered before the flip-flops F1 and the scan clocks on opposed sides of the clock crossing are 180 degrees out of phase.

Figure 6:
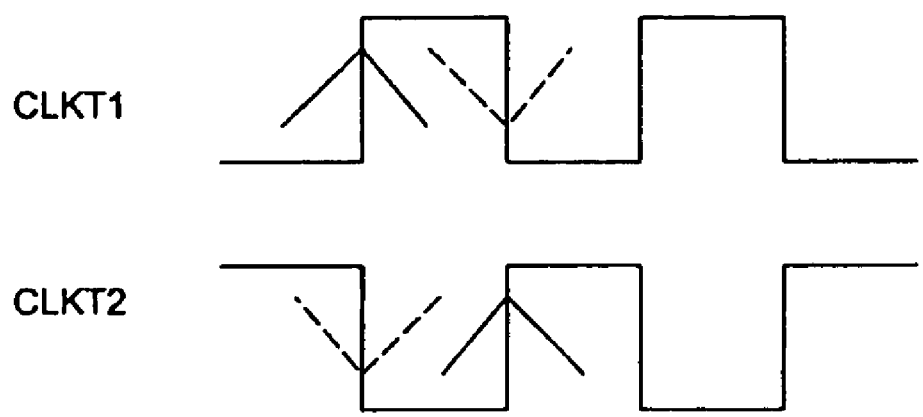
FIG. 6 is another timing diagram of two out-of-phase scan clocks used for the scan chain of FIGS. 3 and 4 when the scan chain includes negative edge-triggered flip-flops.

In the process of arranging the order of the scan cells 36 in the scan chain 38, if the positive edge-triggered flip-flops in the second clock domain 32B have a clock inverted relative the positive edge-triggered flip-flops of the first clock domain 32A as shown in FIG. 6, then the following needs to be undertaken. The flip-flops and their associated scan clock originally in the second clock domain 32B need to be moved to the first clock domain 32A to become flip-flops F1 and scan clock CLKT1, respectively. Likewise, the flip-flops originally in the first clock domain 32A and their associated clock originally in the first clock domain 32A need to be moved to the second clock domain 32B to become flip-flops F2 and scan clock CLKT2, respectively. In this manner, with positive edge-triggered flip-flops, the scan clock waveforms may conform to the waveforms found in FIG. 5 instead of FIG. 6.

Referring to FIG. 4 and the timing diagram of FIG. 6, the flip-flops F1 and F2 may be negative edge-triggered flips-flops, as shown by the dashed arrows on the falling edges of the scan clocks CLKT1 and CLKT2 in FIG. 6. The scan clock CLKT2 is inverted (180 degrees out of phase) relative to the scan clock CLKT1. More specifically, taking the in-phase waveforms of FIG. 2 as a frame of reference (which also are in-phase with the original clock signal), the second clock CLKT2 is inverted in FIG. 6. By inverting the clock CLKT2, the flip-flops F2 may act like positive edge-triggered flip-flops. Hence, the flip-flop F1 of scan cell 36D is a negative edge-triggered flip-flop and the flip-flop F2 of the scan cell 36E acts like a positive edge triggered flip-flop, thereby creating an equivalent combination of having first a negative edge triggered flip-flop followed by a positive edge flip-flop at the clock crossing 34. As a result of (1) the scan clock CLKT2 being inverted relative to the scan clock CLKT1 and (2) the flip-flops F1 (which are driven by the scan clock CLKT1) coming first in the scan chain 38 relative to the flip-flops F2 (which are driven by the scan clock CLKT2), the lockup latch 28 of FIG. 1 is not needed. Regardless of the frame of reference for determining whether the scan clocks are inverted or not, the flip-flops F2 are triggered before the flip-flops F1 and the scan clocks on opposed sides of the clock crossing are 180 degrees out of phase.

In the process of arranging the order of the scan cells 36 in the scan chain 38, if the negative edge-triggered flip-flops in the first clock domain 32A have a clock inverted relative to the negative edge-triggered flip-flops of the second clock domain 32B as shown in FIG. 5, then the flip-flops in the two clock domains need to be switched in the same manner as described with respect to the positive edge-triggered flip-flops so that the scan clock waveforms conform with FIG. 6 instead of FIG. 5. In one embodiment, the order of the flip-flops may be changed, but the scan clock polarity may not be changed.

In summary, in response to the original clock signal, the PMU 40 may provide the appropriate inverted clock signal to one of the clock domains 32A and 32B so that the scan clocks CLKT1 and CLKT2 may be substantially 180 degrees out of phase, but with the same frequency, at the clock crossings 34 of two adjacent clock domains (may be some clock skew as described in the Background section). This relationship between adjacent clock domains, with the previously described arrangements of flip-flops F1 and F2, may provide a sufficient timing margin so that the lockup latch 28 of FIG. 1 may be eliminated. For example, in the above-described embodiment wherein there are positive edge-triggered flip-flops F1 and F2 and the second clock signal CLKT2 is in-phase with the original clock signal, then the PMU 40 may invert the first clock signal CLKT1 to achieve the desired waveform relationship of FIG. 5. Likewise, in the above-described embodiment wherein there are negative edge-triggered flip-flops F1 and F2 and the first clock signal CLKT1 is in-phase with the original clack signal, then the PMU 40 may invert the second clock signal CLKT2 to achieve the desired waveform relationship of FIG. 6.

As previously mentioned, in one embodiment of the scan circuit 31 the scan clocks CLKT1 and CLKT2 may have a frequency of 10 MHz, with such scan clock frequency being used across all the clock domains 32 of the chip 30. Moreover, the scan circuit 31 may take advantage of the previously-described 1:1 clock ratio mode to generate the scan clocks CLKT1 and CLKT2. Since the timing for the interface logic is already balanced in this 1:1 ratio mode (104 MHz:104 MHz) for the normal mode, no extra timing balancing is required for scan mode (10 MHz:10 MHz). This in turn may ease the extent of the scan timing balancing needed.

Both the inversion and the non-inversion of the output clocks CLKT1 and CLKT2, respectively, may be undertaken by the PMU 40 in response to the same original clock source of 10 MHz. In one embodiment, the scan circuit 31 may have a plurality of scan chains 38 crossing a plurality of clock crossings 34; hence, there may be a plurality of inversions of clock domains undertaken by the PMU 40 during the scan mode of operation. As previously mentioned, both the inverted and non-inverted scan clocks may be generated from the PMU 40; however, the original clock signal to PMU 40 is non-inverted. The generation of both the inverted and the non-inverted scan clocks from the common source of the PMU 40 may help to reduce the total number of external scan clocks needed and reduce scan pattern size or number of scan chains 38, as will be explained hereinafter. In the previously described illustrative example of the chip 30 with over 30 clock domains, the number of original scan clocks (and therefore number of external scan pins) provided to the PMU of FIG. 3 may be reduced from 15 to 5.

Referring to FIGS. 3 and 4, the original clock signals are coupled to external scan clock pins of the PMU 40. In the illustrative example of the chip 30 with over 30 clock domains, the number of external scan clock pins, and therefore the number of original scan clock signals may be reduced to 5. Only one original clock may be active at a time. This is accomplished because both of the scan clocks CLKT1 and CLKT2 are driven by the same original clock signal coupled to one external scan clock pin of the PMU 40. Consequently, the system or capture clocks CLK1 and CLK2 may be simultaneously launched, thereby allowing both the flip-flops F1 and F2 to capture data in a single capture cycle. This in turn reduces the number of scan chains 38, which is sometimes referred to as reducing "pattern size". To the contrary, in the prior art embodiment of FIG. 1, the scan clocks CLKT1 and CLKT2 are driven from different external scan clock input pins and therefore different original clocks. When one capture or system clock (either CLK1 or CLK2) is launched to propagate the test pattern through the combination logic circuit 18, the other capture or system clock is made inactive. Consequently, another scan (pattern or stimulus) chain is needed to capture data from the combination logic 18, which increases the number of scan chains or pattern size.

Figure 7:
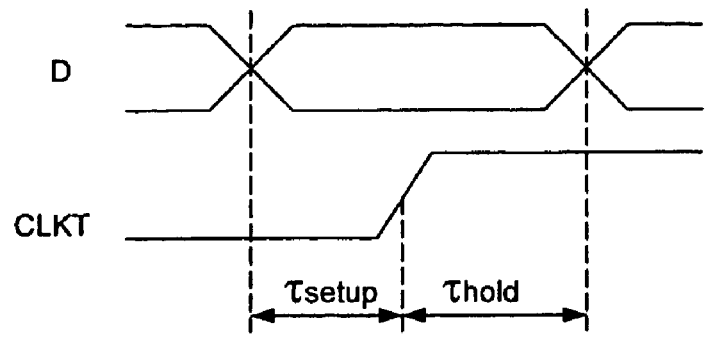
FIG. 7 is a timing diagram illustrating setup and hold times for flip-flops.

Referring to FIGS. 4 and 7, the desired relationships between scan clocks and different arrangements of flip-flops F1 and F2 are now examined further. With the internal inversion clocks of some of the scan clocks, there may be scan setup and hold timing issues to be addressed; such issues depending on whether the flip-flops F1 and F2 of the scan cells 36 contain a positive edge-triggered or negative edge-triggered flip-flop and the position of the flip-flop in the scan chain 38. The positive edge-triggered flip-flops only sample the input data on a positive clock transition—that is, 0 to 1, and the negative edge-triggered flip-flops only sample the input data during a negative clock transition—that is, 1 to 0. The timing diagram of FIG. 7 is provided as background for the discussing these timing margin issues. In FIG. 7 a step-up time "Tsetup" is the time that the data input signal D must be valid at the flip-flops of the scan cells 36 before the clock transitions, such as a positive clock transition from 0 to 1 for a positive edge-triggered flip-flop. A hold time "Thold" is the time the data input signal D must remain valid after the clock edge. Assuming that the setup and hold times are met, the input data D at the flip-flops input D is copied to the Q output of the flip-flop after a propagation delay relative to the clock edge. These timing issues now are described with respect to FIGS. 8-10.

Figure 8:
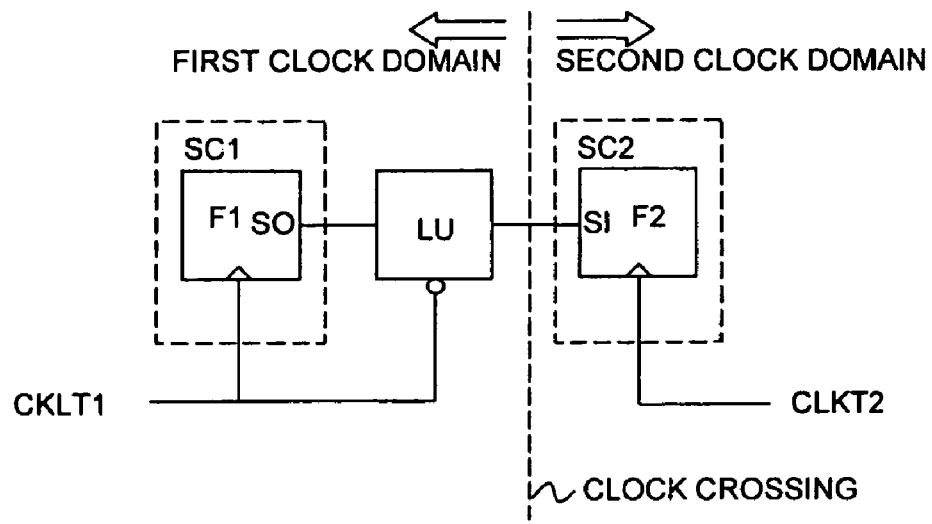
FIG. 8 is a block diagram of a portion of a scan chain used to illustrate timing issues.
Figure 9:
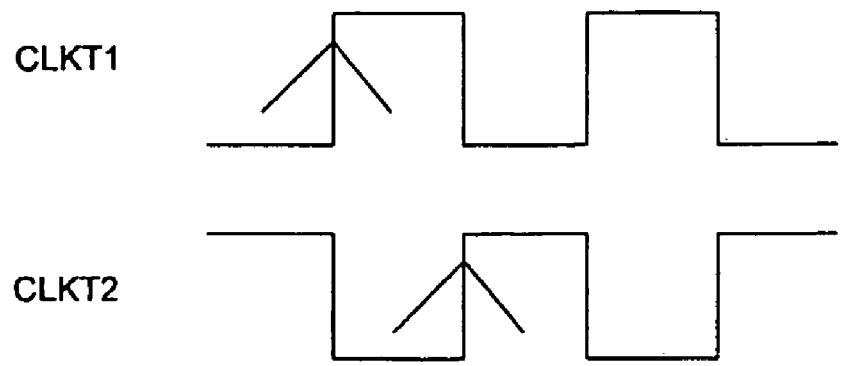
FIG. 9 is a timing diagram of a pair of out-of-phase waveforms used with the scan chain of FIG. 8.
Figure 10:
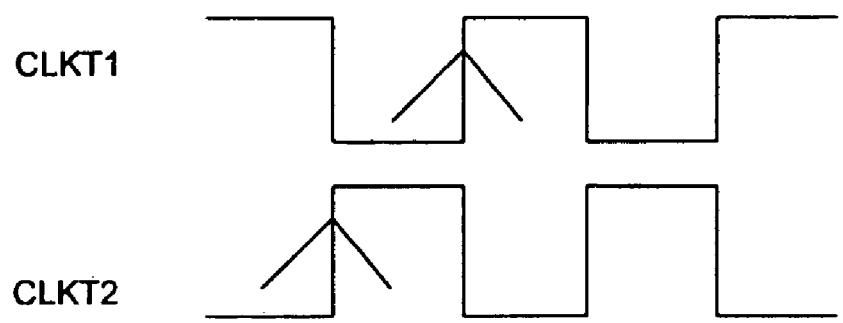
FIG. 10 is a timing diagram of another pair of out-of-phase waveforms used with the scan chain of FIG. 8.

Referring to FIGS. 8 through 10, there is illustrated a first flip-flop F1 of a first scan cell SC1 which is driven by a first scan clock CLKT1 in a first clock domain and a second flip-flop F2 of a second scan cell which is driven by a second scan clock. The scan clock CLKT2 is inverted relative to the scan clock CLKT1. Coupled between the SO output of the flip-flop F1 and the SI input of the flip-flop F2 is a lockup latch LU used in the prior art, which is driven by the first scan clock CLKT1. In this example, the flip-flops F1 and F2 are positive edge-triggered flip-flops. Referring to FIG. 9, an arrow of the scan clock CLKT1 shows the triggering edge for the flip-flop F1, whereas a second arrow of the scan clock CLKT2 shows the triggering edge of the flip-flop F2. If the scan clock CLKT1 is skew to the left, the flip-flop F2 may have a hold timing violation during scan shifting. Referring to FIG. 10, if the scan clock CLKT1 is now inverted, the scan clock CLKT2 is not invented, and the scan clock CLKT1 is skewed to the right, then the flip-flop F2 may have setup timing issue during scan shifting. The timing issues may be overcome by defining the scan clocks to be a 180 degrees out-of-phase by inverting the appropriate scan clock and arranging the flip-flops F1 and F2 in the right order depending upon whether they are positive or negative edge-triggered flip-flops.

Referring to FIGS. 3 and 4, as previously mentioned, in one embodiment the scan cells 36 may comprise the scan-cells 12 of FIG. 1 which includes a mux flip-flop. Another type of scan cell, sometimes referred to as a full-hold scan cell, uses a shadow flip-flop that operates in parallel with a datapath flip-flop, with the shadow flip-flop becoming part of the scan chain. In another embodiment, this full-hold scan cell may be used in the chip 30, with each shadow flip-flop being one of the flip-flops F1 and F2.

Figure 11:
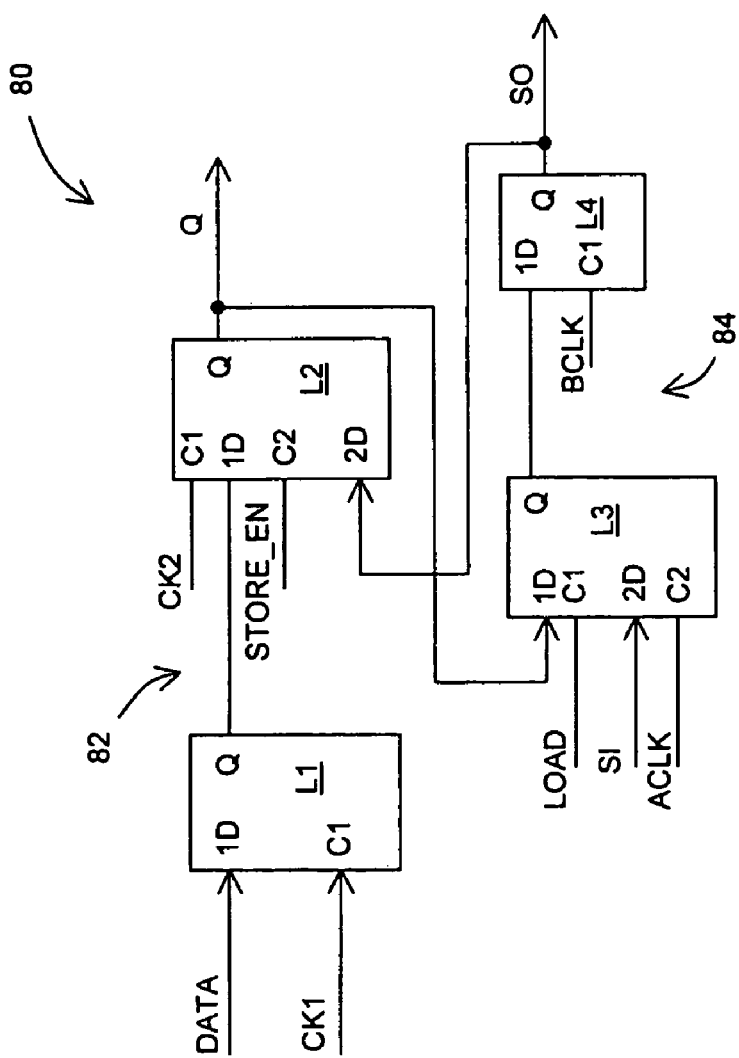
FIG. 11 is a block schematic diagram of a full-hold scan cell which may be used in the scan chain of FIGS. 3 and 4 according to one embodiment of the present invention.

Referring to FIG. 11, such a full-hold scan cell is shown and is identified by the reference number 80. The full-hold scan cell 80 may provide a full shadow of the machine state and enables non-intrusive operation while the chip (not shown) is running or while the system clocks are frozen. The scan cell 80 includes a datapath flip-flop 82 having a first datapath latch L1 and a second datapath latch L2 interposed in a datapath to receive DATA and a system clock phase CK1 and a system clock phase CK2 and to provide an output Q. The clock phases CK1 and CK2 may be two phases of one of the previously-described system clocks CLK1 or CLK2. The particular system clock CLK1 or CLK2 depends upon the clock domain in which the scan cell 80 is located. The cell 80 further includes a shadow flip-flop 84 having a first shadow latch L3 and a second shadow latch L4. The shadow flip-flop 84 may form the flip-flops F1 or F2 in FIG. 4. The scan cell 80 has two modes of operation: a normal mode and a test mode. During the normal mode, scan clock phases ACLK and BCLK (which may be two phases of the scan clock CKLT1 or CKLT2, as the case may be) and a signal Load are set at a logic value 0, and system clock phases CK1 and CK2 are applied. During the test mode, at a first scan cell 10 at an input node, the scan clock phases ACLK and BCLK may be applied alternately to shift in (scan in) a test pattern or scan-in signal SI into shadow latches L3 and L4. Next, the store enable clock STORE_EN is applied to move the contents of latch L4 to latch L2 so that the test pattern has been written into the first flip-flop 12 and then applied in the normal fashion to the combination logic circuit 18 of FIG. 3. A second cell 80 receives the system response to the test pattern from the logic circuit 18 of FIG. 3. The system clock phase CK1 of the second cell 80 may be applied to capture or latch the system response in the latch L1, followed by applying the clock CK2 to move the latched contents of the latch L1 to the latch L2. Finally, the Load signal may be applied to move the contents of latch L2 into latch L3. The system response or scan-out signal SO may now be scanned out by alternately applying scan clock phases ACLK and BCLK.

Figure 12:
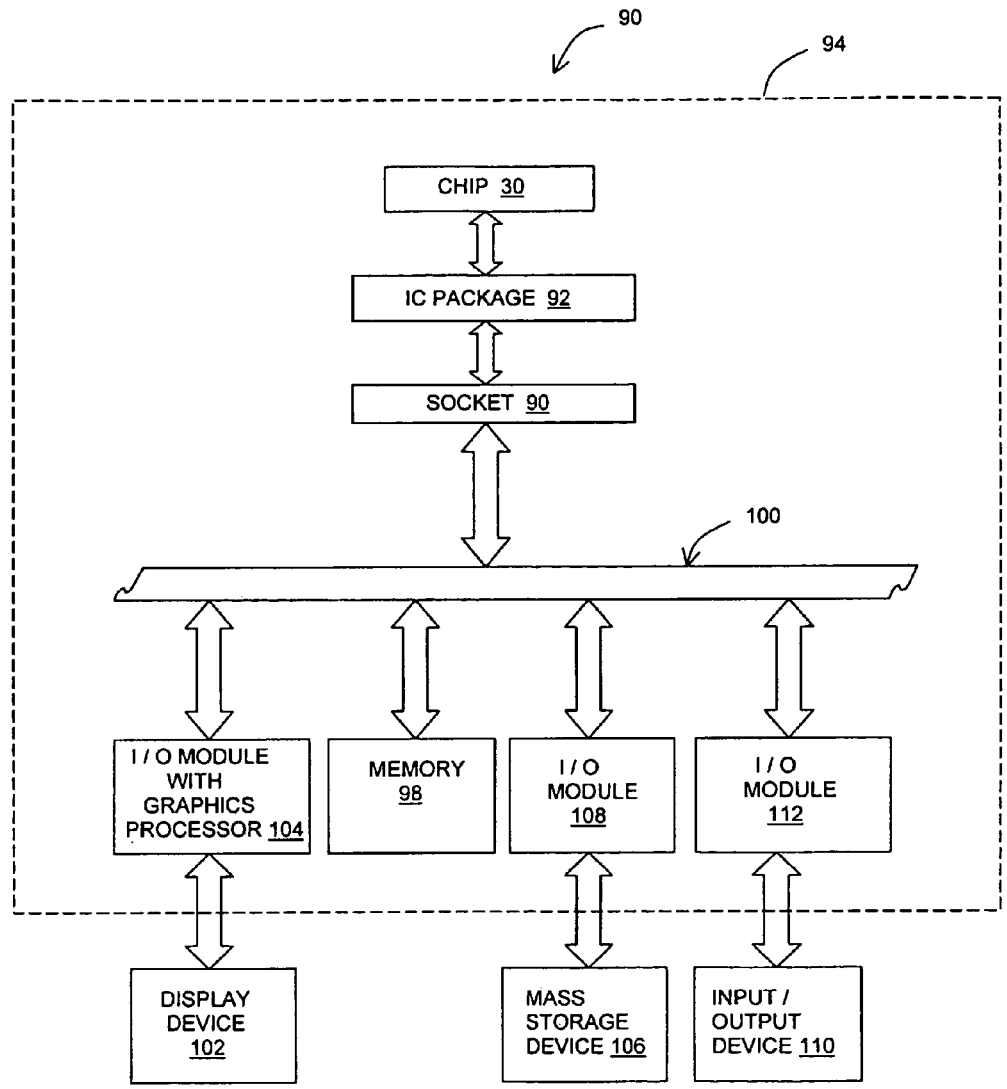
FIG. 12 is a block diagram of a system including a chip incorporating one embodiment of the present invention.

Referring to FIG. 12, there is illustrated a system 90, which is one of many possible systems in which an IC package 92, which includes the chip 30 of FIGS. 3 and 4, may be used. In the system 90, the IC package 92 is mounted on a substrate or printed circuit board (PCB) 94 via a socket 96. The chip 30 of the IC package 92 may be a processor and the PCB 94 may be a motherboard. However, in other systems the IC package 92 may be directly coupled to the PCB 94 (eliminating the socket 96 which allows the IC package 92 to be removable). In addition to the socket 96 and the IC package 92, the PCB 94 may have mounted thereon a main memory 98 and a plurality of input/output (I/O) modules for external devices or external buses, all coupled to each other by a bus system 100 on the PCB 94. More specifically, the system 90 may include a display device 92 coupled to the bus system 100 by way of an I/O module 94, with the I/O module 94 having a graphical processor and a memory. The I/O module 94 may be mounted on the PCB 94 as shown in FIG. 12 or may be mounted on a separate expansion board. The system 90 may further include a mass storage device 96 coupled to the bus system 100 via an I/O module 98. Another I/O device 110 maybe coupled to the bus system 100 via an I/O module 112. Additional I/O modules may be included for other external or peripheral devices or external buses.

Examples of the main memory 98 include, but are not limited to, static random access memory (SRAM) and dynamic random access memory (DRAM). The memory 98 may include an additional cache memory. Examples of the mass storage device 106 include, but are not limited to, a hard disk drive, a compact disk drive (CD), a digital versatile disk driver (DVD), a floppy diskette, a tape system and so forth. Examples of the input/output devices 110 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 94. Examples of the bus system 100 include, but are not limited to, a peripheral control interface (PC[) bus, and Industry Standard Architecture (ISA) bus, and so forth. The bus system 100 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 100. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the chip 30 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

In various embodiments, the system 90 may be a wireless mobile or cellular phone, a pager, a portable phone, a one-way or two-way radio, a personal digital assistant, a pocket PC, a tablet PC, a notebook PC, a desktop computer, a set-top box, an entertainment unit, a DVD player, a server, a medical device, an internet appliance and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A device comprising:
    a scan circuit including a scan chain, the scan chain having
        a first plurality of scan cells that receive a first scan clock signal in a first clock domain; and
        a second plurality of scan cells that receive a second scan clock signal in a second clock domain; and
    a scan clock source that generates the first scan clock signal and the second scan clock signal, and that selectively inverts the first scan clock signal and the second scan clock signal based on
        an operating mode of the first plurality of scan cells and the second plurality of scan cells; and
        respective flip-flop arrangements of the first clock domain and the second clock domain.

2. The device of claim 1, wherein a last scan cell of the first plurality of scan cells is directly connected to a first scan cell of the second plurality of scan cells.

3. The device of claim 1, wherein:
    each scan cell of the first plurality of scan cells and the second pluralities of scan cells includes a flip-flop; and
    each flip-flop in the second plurality of scan cells is triggered before any flip-flop in the first plurality of scan cells.

4. The device of claim 1, wherein:
    a first scan cell in the first clock domain receives a scan-in signal based on the first scan clock signal; and
    a last scan cell in the second clock domain generates a scan-out signal based on the second scan clock signal.

5. The device of claim 1, wherein the scan clock source receives an external clock signal and generates the first scan clock signal and the second scan clock signal based on the external clock signal.

6. The device of claim 5, wherein:
    each scan cell of the first plurality of scan cells and the second plurality of scan cells includes a positive edge-triggered flip-flop; and
    the first scan clock signal is inverted relative to the external clock signal.

7. The device of claim 5, wherein:
    each scan cell of the first plurality of scan cells and the second plurality of scan cells includes a negative edge-triggered flip-flop; and
    the second scan clock signal is inverted relative to the external clock signal.

8. The device of claim 1, wherein the scan circuit comprises a plurality of the scan chains.

9. An integrated circuit (IC) comprising the device of claim 1.

10. A method comprising:
    receiving a first scan clock signal at a first plurality of scan cells in a first clock domain;
    receiving a second scan clock signal at a second plurality of scan cells in a second clock domain;
    generating the first scan clock signal and the second scan clock signal at a scan clock source; and
    selectively inverting the first scan clock signal and the second scan clock signal based on
        an operating mode of the first plurality of scan cells and the second plurality of scan cells; and
        respective flip-flop arrangements of the first and second clock domains.

11. The method of claim 10, further comprising directly connecting a last scan cell of the first plurality of scan cells to a first scan cell of the second plurality of scan cells.

12. The method of claim 10, wherein:
    each scan cell of the first plurality of scan cells and the second plurality of scan cells includes a flip-flop; and
    each flip-flop in the second plurality of scan cells is triggered before any flip-flop in the first plurality of scan cells.

13. The method of claim 10, further comprising:
    receiving a scan-in signal at a first scan cell in the first clock domain based on the first scan clock signal; and
    generating a scan-out signal at a last scan cell in the second clock domain based on the second scan clock signal.

14. The method of claim 10, further comprising:
    receiving an external clock signal; and
    generating the first scan clock signal and the second scan clock signal based on the external clock signal.

15. The method of claim 14, wherein:
    each scan cell of the first plurality of scan cells and the second plurality of scan cells includes a positive edge-triggered flip-flop; and
    the first scan clock signal is inverted relative to the external clock signal.

16. The method of claim 14, wherein:
    each scan cell of the first plurality of scan cells and the second plurality of scan cells includes a negative edge-triggered flip-flop; and
    the second scan clock signal is inverted relative to the external clock signal.

\* \* \* \* \*